(12) United States Patent
Honda

(10) Patent No.: US 10,250,206 B2
(45) Date of Patent: Apr. 2, 2019

(54) VOLTAGE DETECTION CIRCUIT

(71) Applicant: DENSO CORPORATION, Kariya, Aichi-pref. (JP)

(72) Inventor: Kazutaka Honda, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/730,918

(22) Filed: Oct. 12, 2017

(65) Prior Publication Data

US 2018/0131337 A1    May 10, 2018

(30) Foreign Application Priority Data

Nov. 7, 2016    (JP) .................... 2016-217161

(51) Int. Cl.

| G01R 19/04 | (2006.01) |
| H03F 3/45 | (2006.01) |
| G01R 1/20 | (2006.01) |
| G01R 19/00 | (2006.01) |
| H03K 5/08 | (2006.01) |
| H03K 17/00 | (2006.01) |

(52) U.S. Cl.
CPC .......... *H03F 3/45179* (2013.01); *G01R 1/20* (2013.01); *G01R 19/0053* (2013.01); *G01R 19/0084* (2013.01); *G01R 19/04* (2013.01); *H03F 3/45475* (2013.01); *H03K 5/08* (2013.01); *H03K 17/002* (2013.01); *H03F 2203/45514* (2013.01); *H03F 2203/45551* (2013.01)

(58) Field of Classification Search
CPC .. G01R 1/203; G01R 15/146; G01R 19/0007; G01R 31/26; G01R 31/2642; G01R 31/2648; G01R 31/2831; G01R 31/31702
See application file for complete search history.

(56) References Cited

U.S. PATENT DOCUMENTS

| 6,559,720 | B1* | 5/2003 | Huijsing et al. |
| 6,762,627 | B1* | 7/2004 | Gater |
| 9,143,092 | B2 | 9/2015 | Huijsing et al. |
| 2009/0179650 | A1* | 7/2009 | Omagari |
| 2015/0109161 | A1 | 4/2015 | Trampitsch |

* cited by examiner

*Primary Examiner* — Tung X Nguyen
(74) *Attorney, Agent, or Firm* — Posz Law Group, PLC

(57) ABSTRACT

A voltage detection circuit includes two detection capacitors, which are paired and configured differentially, first to third detection switches, a drive part, a minimum selector and a maximum selector. The first detection switch is formed of a pMOS transistor, which opens and closes a path between one of the detection capacitors and an input node. The second detection switch is formed of an nMOS transistor, which opens and closes a path between the other of the detection capacitors and an input node. The third detection switch is formed of a series circuit of a pMOS transistor and an nMOS transistor, which open and close a path between two detection capacitors. The driving part turns on and off complementarily between the first and second switches and the third detection switch. The minimum selector applies a lower one of voltages of the input nodes as a substrate potential of the nMOS transistor. The maximum selector applies a higher one of the voltages of the input nodes as a substrate potential of the pMOS transistor.

11 Claims, 11 Drawing Sheets

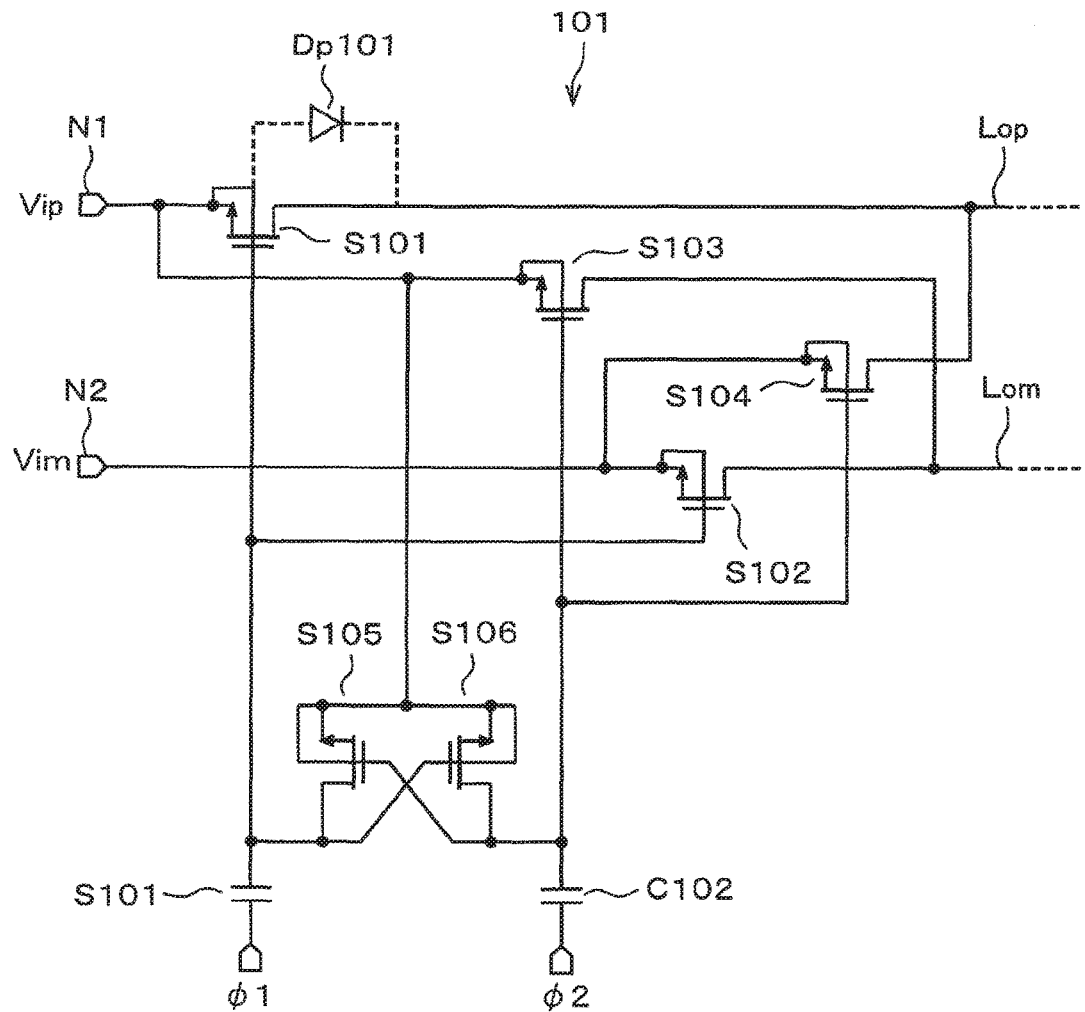
FIG. 3    FIRST COMPARISON EXAMPLE
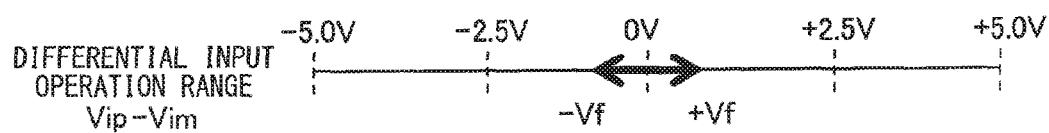
FIG. 4    FIRST COMPARISON EXAMPLE

FIG. 5    SECOND COMPARISON EXAMPLE
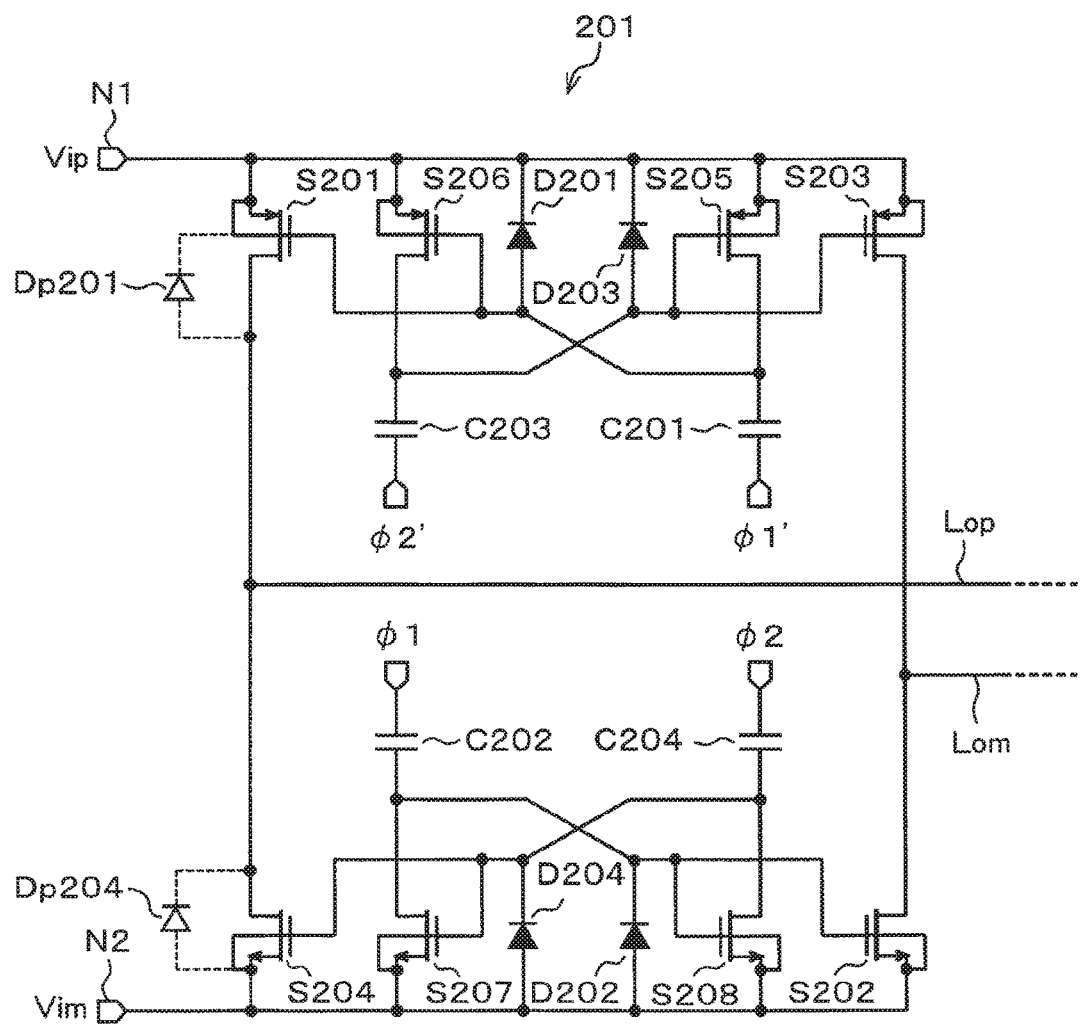
FIG. 6    SECOND COMPARISON EXAMPLE
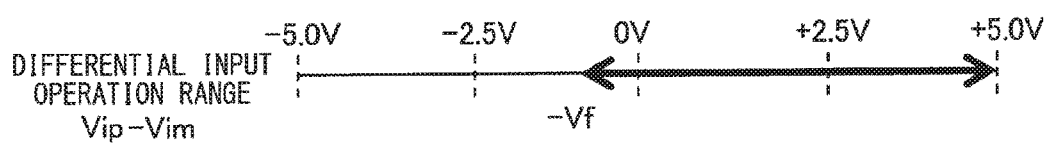

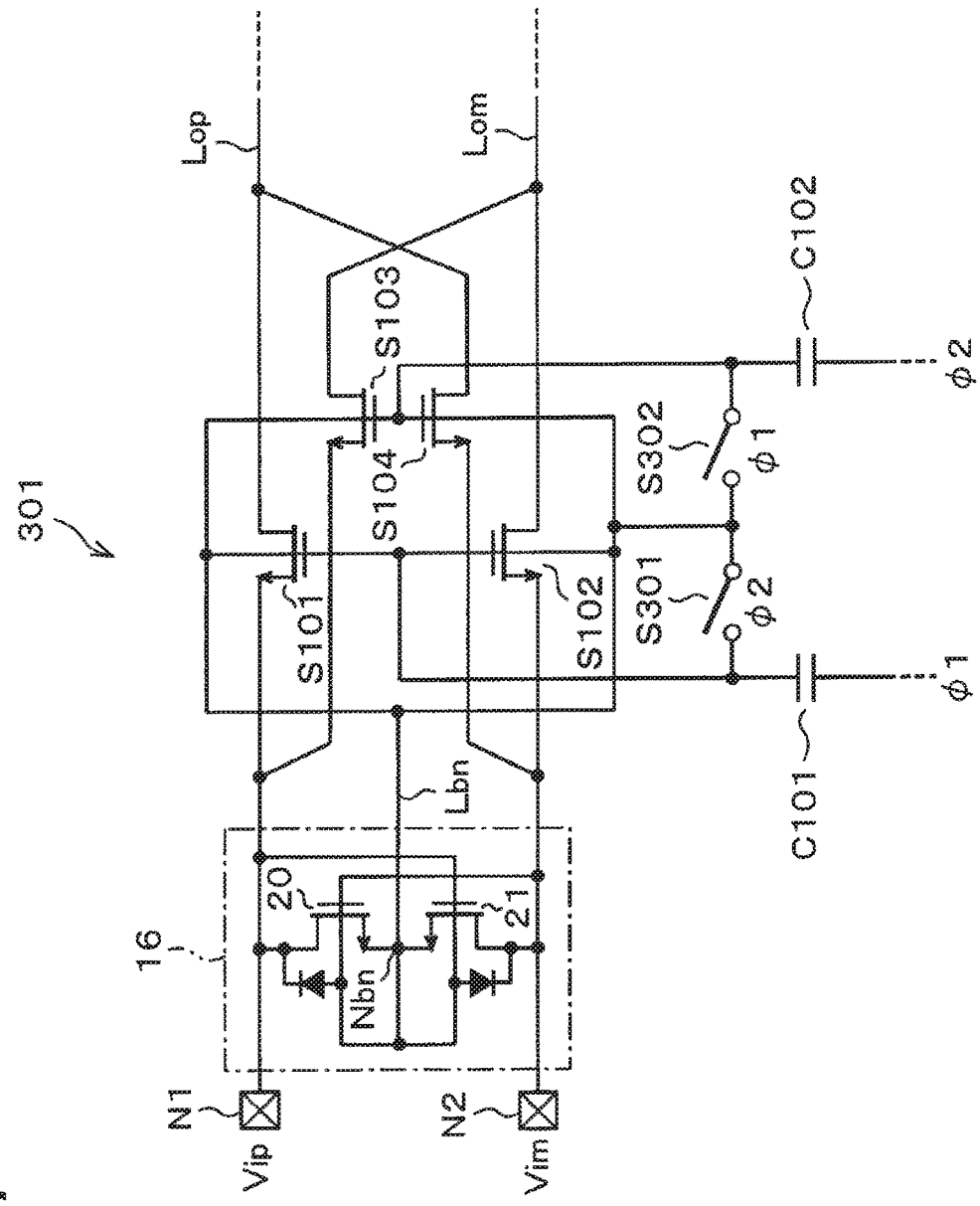
FIG. 7  THIRD COMPARISON EXAMPLE

FIG. 8 THIRD COMPARISON EXAMPLE
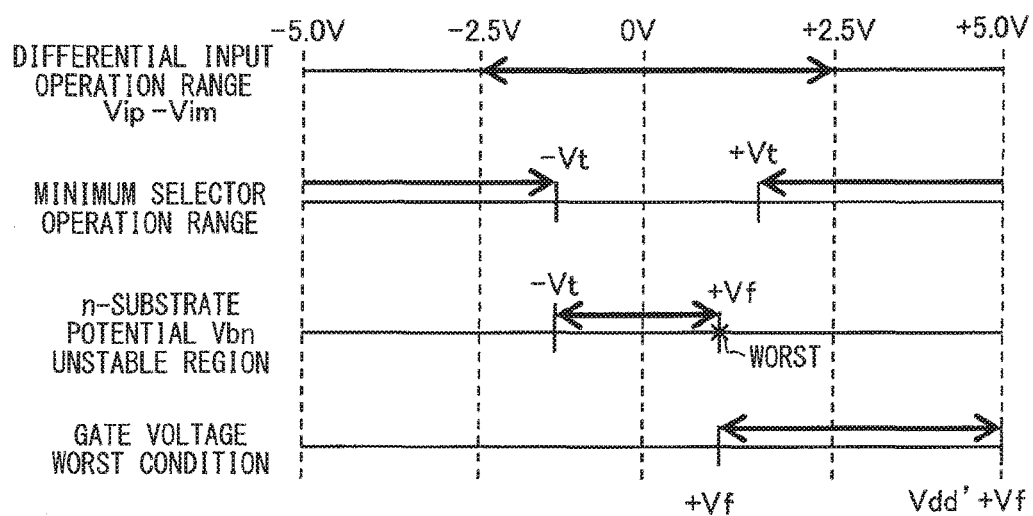
FIG. 10
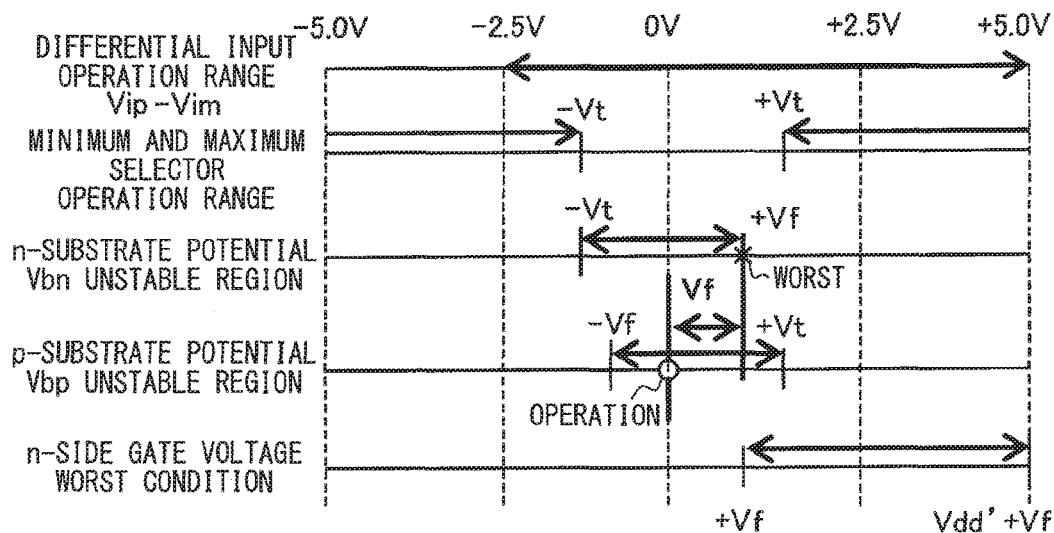

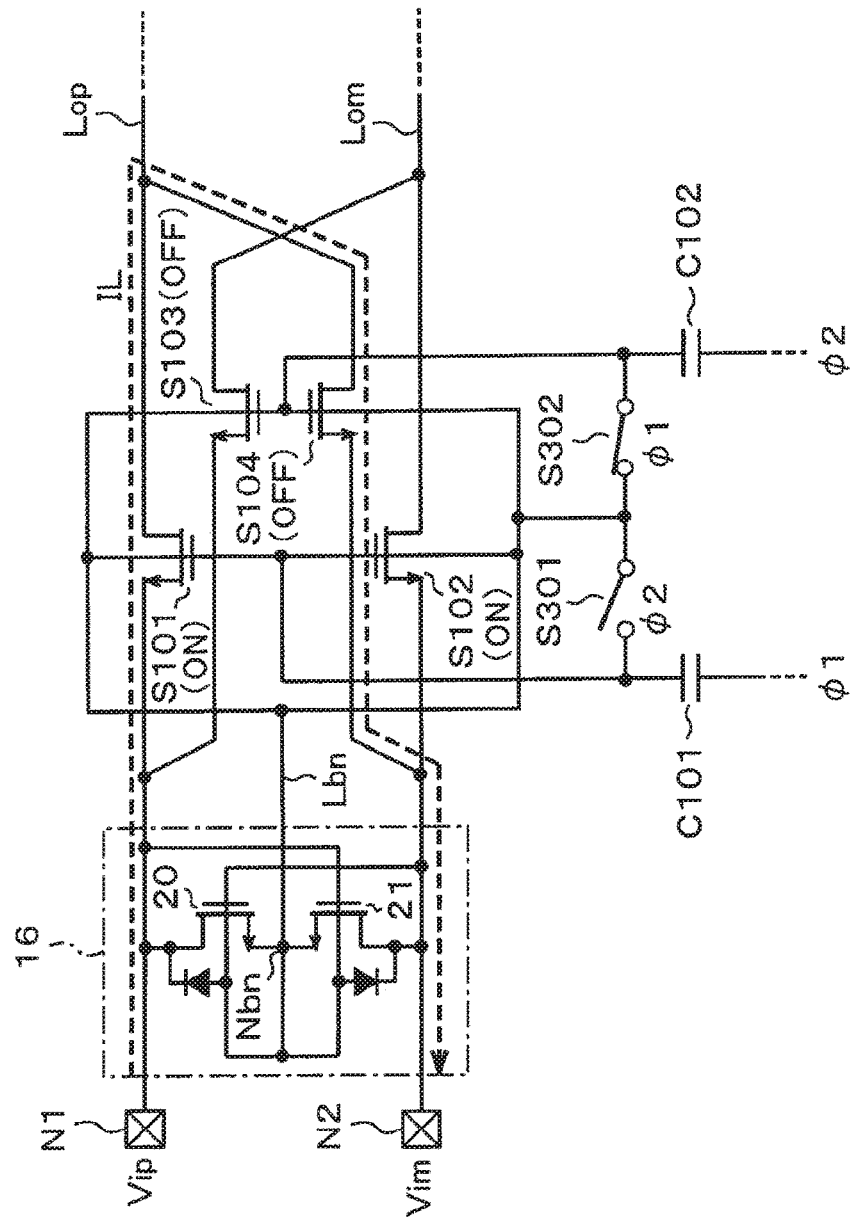
FIG. 9  THIRD COMPARISON EXAMPLE

VOLTAGE DETECTION CIRCUIT

CROSS REFERENCE TO RELATED APPLICATION

The present application is based on Japanese patent application No. 2016-217161 filed on Nov. 7, 2016, the whole contents of which are incorporated herein by reference.

TECHNICAL FIELD

The present disclosure relates to a voltage detection circuit, which detects a positive and negative differential voltage.

BACKGROUND

Various voltage detection circuits, which detect a differential voltage between two input nodes, are proposed. For example, U.S. Pat. No. 9,143,092 discloses a configuration, which detects a voltage by chopping a MOS transistor switch formed of four N-channel type MOS transistors coupled capacitively.

For a voltage detection circuit used to detect a voltage of a battery cell such as a fuel cell, it is required to be able to detect a differential voltage of both of a positive polarity and a negative polarity and reduce a voltage detection error, which is caused by a leak current flowing through a body diode of a MOS transistor. Conventional voltage detection circuits are not satisfactory to meet these requirements.

SUMMARY

It is therefore an object to provide a voltage detection circuit, which is capable of suppressing generation of a leak current and detecting a differential voltage over a wide range.

According to one aspect, a voltage detection circuit of a differential configuration is provided to sample voltages of two input nodes and detects a differential voltage between sampled voltages. The voltage detection circuit comprises two detection capacitors, a first detection switch, a second detection switch, a third detection switch, a driving part, a minimum selector and a maximum selector. The two detection capacitors are paired in a differential configuration. The first detection switch is formed of a P-channel type MOS transistor for opening and closing a path between one of the two detection capacitors and one of the two input nodes. The second detection switch is formed of an N-channel type MOS transistor for opening and closing a path between an other of the two capacitors and an other of the two input nodes. The third detection switch is formed of at least one of a P-channel type MOS transistor and an N-channel type MOS transistor for opening and closing a path between the two detection capacitors. The driving part drives the first detection switch and the second detection switch complementarily to the third detection switch such that the first detection switch and the second detection switch are turned on and off when the third detection switch is turned off and on, respectively. The minimum selector selects a lower one of the voltages of the two input nodes and applies a selected voltage as a substrate potential of the N-channel type MOS transistor. The maximum selector selects a higher one of the voltages of the two input nodes and applies a selected voltage as a substrate potential of the P-channel type MOS transistor.

According to another aspect, a voltage detection circuit of a differential configuration is provided to sample voltages of two input nodes and detects a differential voltage between sampled voltages. The voltage detection circuit comprises two detection capacitors, a first detection switch, a second detection switch, a third detection switch, a fourth detection switch, a driving part, a minimum selector and a maximum selector. The two detection capacitors are paired in a differential configuration. The first detection switch includes a series circuit of a P-channel type MOS transistor and an N-channel type MOS transistor and opens and closes a path between one of the two detection capacitors and one of the two input nodes. The second detection switch includes a series circuit of a P-channel type MOS transistor and an N-channel type MOS transistor and opens and closes a path between the other of the two capacitors and the other of the two input nodes. The third detection switch includes a series circuit of a P-channel type MOS transistor and an N-channel type MOS transistor and opens and closes a path between the one of the two detection capacitors and the other of the two input nodes. The fourth detection switch includes a series circuit of a P-channel type MOS transistor and an N-channel type MOS transistor and opens and closes a path between the other of the two detection capacitors and the one of the two input nodes. The driving part drives the first detection switch, the second detection switch, the third detection switch and the fourth detection switch thereby to turn on and off the first detection switch and the second detection switch and to turn on and off the third detection switch and the fourth detection switch complementarily. The minimum selector selects a lower one of the voltages of the two input nodes and applies a selected voltage as a substrate potential of the N-channel type MOS transistor. The maximum selector selects a higher one of the voltages of the two input nodes and applies a selected voltage as a substrate potential of the P-channel type MOS transistor.

BRIEF DESCRIPTION OF THE DRAWINGS

FIG. 3 is a circuit diagram schematically showing a high voltage side of a voltage detection circuit according to a first comparison example;

FIG. 4 is a chart showing a differential input operation range in the first comparison example;

FIG. 5 is a circuit diagram schematically showing a high voltage side of a voltage detection circuit according to a second comparison example;

FIG. 6 is a chart showing a differential input operation range in the second comparison example;

FIG. 7 is a circuit diagram schematically showing a high voltage side of a voltage detection circuit according to a third comparison example;

FIG. 8 is a chart showing a differential input operation range, an operation range of a minimum selector and an unstable range of a substrate potential and a gate voltage of an nMOS transistor in the third comparison example;

FIG. 9 is a circuit diagram showing a leak current generation path in the third comparison example;

FIG. 10 is a chart showing a differential input operation range, operation ranges of a minimum selector and a maximum selector and an unstable range of each substrate potential and a gate voltage in the first embodiment;

DETAILED DESCRIPTION OF THE EMBODIMENT

Figure 1:
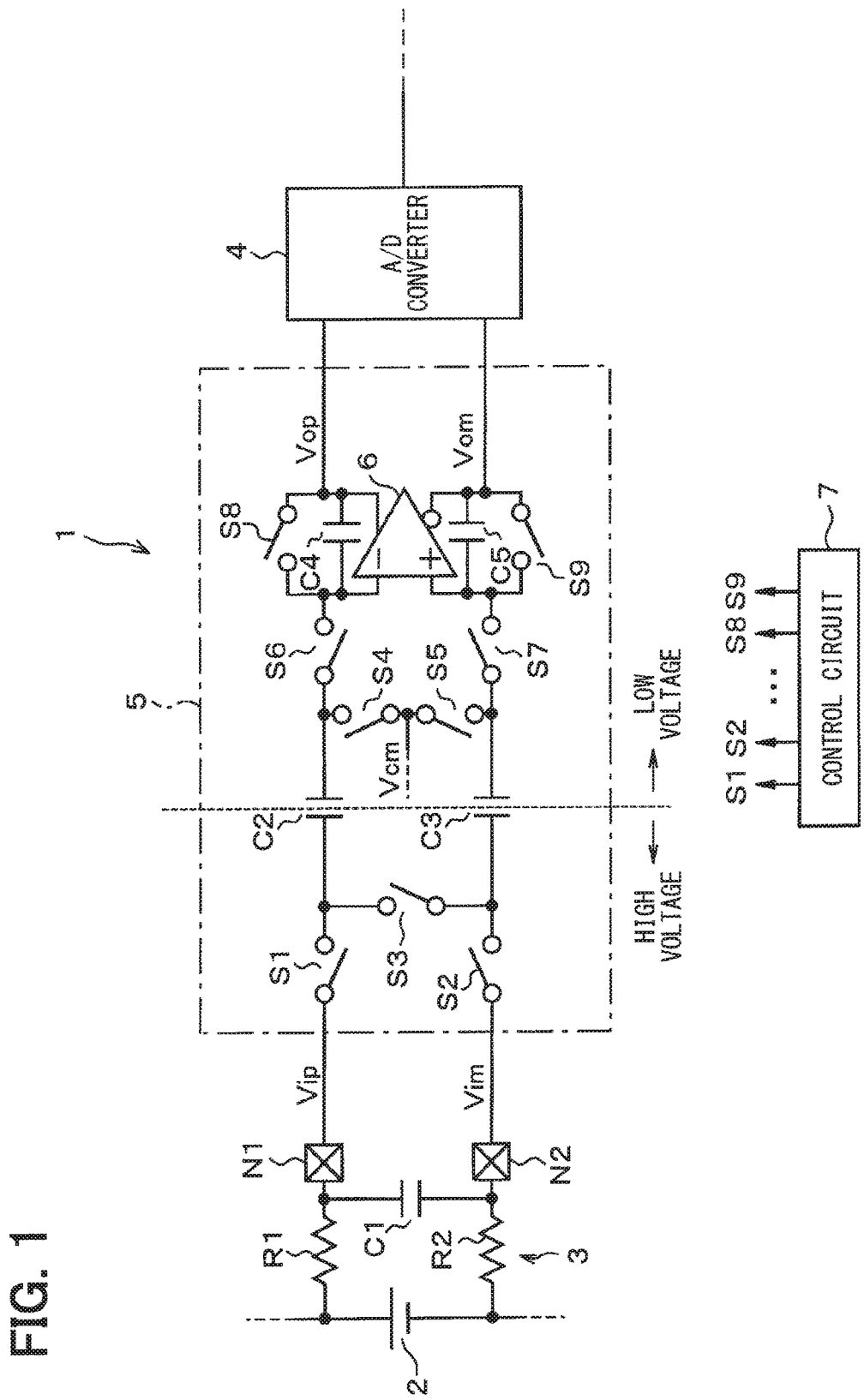
FIG. 1 is a circuit diagram schematically showing a voltage detection circuit according to a first embodiment.

A voltage detection circuit will be described next with reference to multiple embodiments shown in the drawings. In the following embodiments, substantially same structural parts are indicated by same reference numerals for simplification of description.

First Embodiment

A first embodiment of a voltage detection circuit will be described with reference to FIG. 1 to FIG. 12.

As shown in FIG. 1, a voltage detection circuit 1 detects a differential voltage ΔVi, which is a voltage difference between a voltage Vip at an input node N1 and a voltage Vim at an input node N2. The input node N1 is connected to a high potential side terminal of a battery cell 2 through a resistor R1. The input node N2 is connected to a low potential side terminal of the battery cell 2 through a resistor R2. A capacitor C1 is connected between the input nodes N1 and N2. The capacitor C1 forms an RC filter 3 jointly with the resistors R1 and R2 for filtering out noises. Each circuit of the circuit 1 is provided in an integrated circuit (IC) together with other circuits such as an A/D converter 4. The A/D converter 4 is, for example, a ΔΣ type converter, which has high accuracy for detecting a voltage of the battery cell 2 with high accuracy.

The battery cell 2 is, for example, a lithium-ion battery, a fuel cell and the like. The battery cell 2 is connected in series with other battery cells (not shown) of multiple stages to form a battery pack. For this reason, a common mode voltage is superimposed on the battery cell 2. The common mode voltage increases as the battery cell 2 is provided at a higher stage of the battery pack, that is, at a higher potential side. The common mode voltage superimposed on the battery cell 2 is, for example, about several tens volts to hundreds of volts.

A differential voltage detection circuit 5 is a sample-hold circuit of a differential configuration, which samples the voltages Vip and Vim of the input nodes N1 and N2 and detects the differential voltage ΔVi, which is a difference between sampled two input voltages. The differential voltage detection circuit 5 includes an operational (OP) amplifier 6 of a differential output type, capacitors C2 to C5 and switches S1 to S9. The differential voltage detection circuit 5 also performs level shifting from a high common mode voltage to a low common mode reference voltage Vcm.

The common voltage of the OP amplifier 6 is set to be equal to the reference voltage Vcm used as a reference for voltage detection. The reference voltage Vcm is set to be an intermediate voltage (for example, +2.5V) of a power supply voltage VDD (for example, +5V) for each circuit of the voltage detection circuit 1. The OP amplifier 6 outputs differential voltages Vop and Vom from its non-inverting output terminal and inverting output terminal, respectively.

The differential voltages Vop and Vom correspond to detection voltages, which are converted into digital data by the differential input type A/D converter 4. This digital data indicates a detection value of the differential voltage ΔVi and acquired and used by a control device (not shown).

Capacitors C2 and C3 are paired as detection capacitors and charged and discharged by the voltages Vip and Vim, respectively. The capacitors C2 and C3 have same capacitance values, which need not be completely equal but may be slightly different. The capacitors C2 and C3 are laid out symmetrically in integrated circuit design to be paired suitably. With this configuration, detection errors, which arise from various variations caused in an IC manufacturing process, for example, are reduced.

Switches S1 and S2 are connected between one ends of the capacitors C2 and C3 and the input nodes N1 and N2, respectively. The switch S1 is a first detection switch, which is turned on and off to close and open a path between the detection capacitor C2 and the input node N1, that is, to connect and disconnect the detection capacitor C2 and the input node N1. The switch S2 is a second detection switch, which is turned on and off to close and open a path between the detection capacitor C3 and the input node N2, that is, to connect and disconnect the detection capacitor C3 and the input node N2. A switch S3 is connected between one ends of the capacitors C2 and C3. The switch S3 is a third detection switch, which is turned on and off to close and open a path between the capacitors C2 and C3, that is, to connect and disconnect the capacitors C2 and C3.

The reference voltage Vcm is applicable to the other ends of the capacitors C2 and C3 through switches S4 and S5, respectively. The other ends of the capacitors C2 and C3 are connected to an inverting input terminal and a non-inverting input terminal of the OP amplifier 6 through switches S6 and S7. A switch S8 and a capacitor C4 are connected in parallel between the inverting input terminal and the non-inverting output terminal of the OP amplifier 6. A switch S9 and a capacitor C5 are connected in parallel between the non-inverting input terminal and the inverting output terminal of the OP amplifier 6.

The switches S1 to S9 are controlled to turn on and off by a control circuit 7, which is configured to control an operation of the differential voltage detection circuit 5. A group of the switches S1, S2, S4, S5, S8 and S9 are turned on and off and a group of the switches S3, S6 and S7 are turned off and on, respectively. That is, these two groups are turned on and off complementarily. Although these two groups are turned on and off complementarily, it is allowable that both groups are turned off at the same time, that is, at dead time. In this configuration, circuit elements connected between the capacitors C2, C3 and the battery pack receive the high common mode voltage, which is superimposed on the battery cell 2. For this reason, these circuit elements have high rated withstanding voltages and other circuit elements have low rated withstanding voltages.

Each of the switches S1 to S9 is formed of a MOS transistor, which is driven under control by the control circuit 7, The control circuit 7 operates with the same power supply voltage VDD of +5V as other circuits provided in the IC. Thus, it is possible to drive the switches S4 to S9 provided at a low voltage side directly by driving signals generated by the control circuit 7 but it is not possible to drive the switches S1 to S3 provided at a high voltage side directly by driving signals of the control circuit 7.

For this reason, the switches S1 to S3 provided at the high voltage side are driven by a capacitive driving method, which drives the switches by way of capacitors (capacitances). In the capacitive driving method, a charge pump operable with a driving signal is provided to drive the MOS transistors with the output voltage of the charge pump circuit. The switches S1 to S3 may be driven capacitively by a circuit configuration, which is exemplarily shown in FIG. 2.

Figure 2:
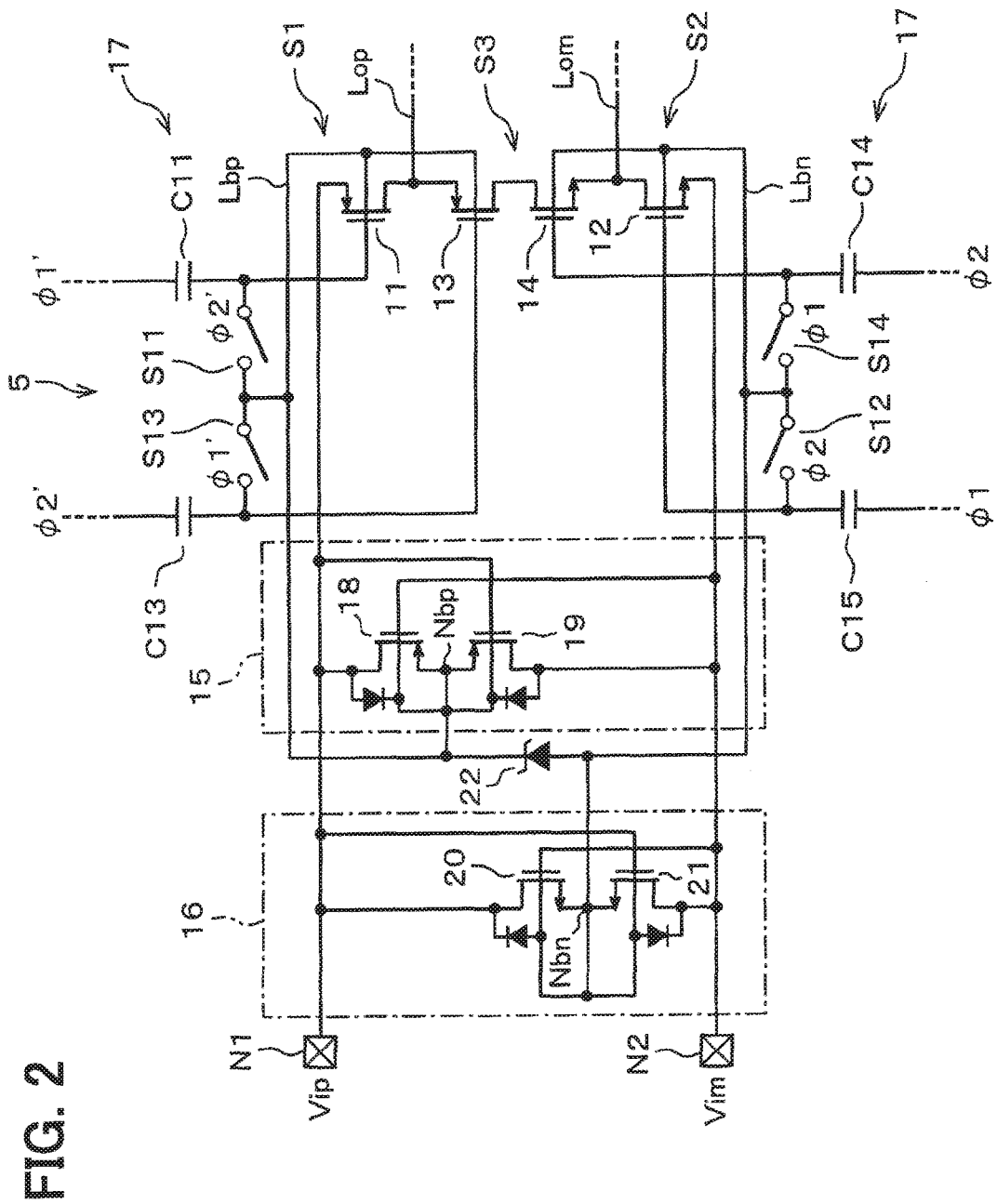
FIG. 2 is a circuit diagram schematically showing a high voltage side of the voltage detection circuit according to the first embodiment.

As shown in FIG. 2, the first detection switch S1 is formed of a P-channel type MOS transistor 11. In the following description, the P-channel type MOS transistor is referred to as a pMOS transistor simply. A source and a drain of the pMOS transistor 11 are connected to the input node N1 and a signal line Lop, respectively. The signal line Lop is connected to the detection capacitor C2.

The second detection switch S2 is formed of an N-channel type MOS transistor 12. The N-channel type MOS transistor is referred to as nMOS transistor simply. A source and a drain of the nMOS transistor 12 are connected to the input node N2 and a signal line Lom, respectively. The signal line Lom is connected to the detection capacitor C3. The third detection switch S3 is formed of a pMOS transistor 13 and an nMOS transistor 14, which are connected in series. A source and a drain of the pMOS transistor 13 is connected to the signal line Lop and a drain of the nMOS transistor 14, respectively. A source of the nMOS transistor 14 is connected to the signal line Lom.

Backgates of the pMOS transistor 11 and the pMOS transistor 13 are connected to a substrate potential supply line Lbp. A voltage outputted from an output node Nbp of a maximum selector 15 is applied to the substrate potential supply line Lbp. Backgates of the nMOS transistor 12 and the nMOS transistor 14 are connected to a substrate potential supply line Lbn. A voltage outputted from an output node Bbn of a minimum selector 16 is applied to the substrate potential supply line Lbn.

A gate of the pMOS transistor 11 is connected to the substrate potential supply line Lbp through a switch S11 and one end of a capacitor C11. A driving signal φ1' is applied to the other end of the capacitor C11. A gate of the pMOS transistor 13 is connected to the substrate potential supply line Lbp through a switch S13 and connected to one end of a capacitor C13. A driving signal φ2' is applied to the other end of the capacitor C13.

A gate of the nMOS transistor 12 is connected to the substrate potential supply line Lbn through a switch S12 and connected to one end of a capacitor C12. A driving signal φ1 is applied to the other end of the capacitor C12. A gate of the nMOS transistor 14 is connected to the substrate potential supply line Lbn through a switch S14 and connected to one end of a capacitor C14. A driving signal φ2 is applied to the other end of the capacitor C14.

Each of the switches S11 to S14 may have same configuration as switches S205 to S208 of a second comparative example shown in FIG. 5 and described later.

The driving signals φ1, φ2, φ1', φ2° are generated by the control circuit 7 and have the same amplitude as the power supply voltage VDD (+5V). The driving signals φ1 and φ2 are opposite phase signals. The driving signals φ1' and φ2' are inverted signals of the driving signals φ1 and φ2, respectively.

The switches S11 to S14 are turned on and off by the driving signals described above. More specifically, the switch S11 is turned on and off when the driving signal φ2° is at the high level (for example, +5V) and the low level (for example, 0V), respectively. The switch S13 is turned on and off when the driving signal φ1' is at the high level and the low level, respectively.

The switch S12 is turned on and off when the driving signal φ2 is at the high level and the low level, respectively. The switch S14 is turned on and off when the driving signal φ1 is at the high level and the low level, respectively. In the configuration described above, the switches S11 to S14 and the capacitors C11 to C14 form a driving part 17, which drives the pMOS transistors 11 and 13 and the nMOS transistors 12 and 14, that is, the switches S1 to S3.

The maximum selector 15 includes two pMOS transistors 18 and 19. A drain of the pMOS transistor 18 is connected to the input node N1. A drain of the pMOS transistor 19 is connected to the input node N2. A gate of the pMOS transistor 18 is connected to the input node N2. A gate of the pMOS transistor 19 is connected to the input node N1.

Sources and backgates of the pMOS transistors 18 and 19 are connected to the output node Nbp. The output node Nbp is connected to the substrate potential supply line Lbp. A body diode exists between the backgate and the drain of the pMOS transistor 18 with its anode at the drain side. A body diode exists between the backgate and the drain of the pMOS transistor 19 with its anode at the drain side.

With the configuration described above, the maximum selector 15 is configured to select a higher one of the voltages applied to the input nodes N1 and N2 and apply the selected higher voltage to the backgates of the pMOS transistors 11 and 13 as the substrate potential through the output node Nbp and the substrate potential supply line Lbp.

The minimum selector 16 includes two nMOS transistors 20 and 21. A drain of the nMOS transistor 20 is connected to the input node N1. A drain of the nMOS transistor 21 is connected to the input node N2. A gate of the nMOS transistor 20 is connected to the input node N2. A gate of the nMOS transistor 21 is connected to the input node N1.

Sources and backgates of the nMOS transistors 20 and 21 are connected to an output node Nbn. The output node Nbn is connected to the substrate potential supply line Lbn. A body diode exists between the drain and the backgate of the pMOS transistor 20 with its anode at the backgate side. A body diode exists between the drain and the backgate of the pMOS transistor 21 with its anode at the backgate side.

With the configuration described above, the maximum selector 15 is configured to select a lower one of the voltages applied to the input nodes N1 and N2 and apply the selected lower voltage to the backgates of the nMOS transistors 12 and 14 as the substrate potential through the output node Nbn and the substrate potential supply line Lbn.

As described later in more detail, the maximum selector 15 and the minimum selector 16 configured as described above, have unstable operation regions, in which the maximum selector 15 and the minimum selector 16 cannot operate normally and the operations are unfixed. For this reason, in the configuration described above, a Zener diode 22 is connected between the substrate potential supply lines Lbp and Lbn with its anode at the substrate potential supply line Lbn side. The Zener diode 22 is provided as a potential fixing part to fix a relation of the substrate potential of the pMOS transistors 11, 13 and the substrate potential of the nMOS transistors 12, 14 in a predetermined potential relation.

In the voltage detection circuit 1 configured as described above, it is preferred to uses a substrate of a triple-well structure or an SOI (silicon-on-insulator) substrate so the substrate potential of the nMOS transistor may be controlled by the minimum selector 16.

The first embodiment described above provides the following advantages.

In the differential voltage detection circuit 5, each voltage of the input nodes N1 and N2 is sampled by the capacitors C2 and C3 when the first and second detection switches S1 and S2 are turned on and the third detection switch S3 is turned off. The sampled electric charges are transferred when the first and second detection switches S1 and S2 are turned off and the third detection switch S3 is turned on. By repetition of this sequence of operations in the differential voltage detection circuit 5, the differential voltage Vip-Vim between the input nodes N1 and N2 is detected.

In the configuration described above, the first detection switch S1 is formed of the pMOS transistor 11, the second detection switch S2 is formed of the nMOS transistor 12 and the third detection switch S3 is formed of the series circuit of the pMOS transistor 13 and the nMOS transistor 14. That is, the switches S1 to S3 are formed of a combination of pMOS transistors and nMOS transistors. As a result, according to the first embodiment, a range of operation, that is, a voltage detection range can be widened as described below further.

In addition, in the first embodiment described above, the substrate potential of each of the MOS transistors forming the switches is controlled by the maximum selector 15 and the minimum selector 16. That is, the substrate potential of the pMOS transistors 11 and 13 are controlled to the higher one of the voltages applied to the input nodes N1 and N2. Further, the substrate potential of the nMOS transistors 12 and 14 are controlled to the lower one of the voltages applied to the input nodes N1 and N2. For this reason, it is possible to prevent the body diode of each MOS transistor forming the first to third detection switches S1 to S3 from generating a leak current. As a result, according to the first embodiment, it is possible to detect both the positive and negative differential voltages over a wide range and with high accuracy while suppressing generation of the leak current.

The advantages provided by the first embodiment will be made more clear by comparison of the first embodiment with the following comparison examples. Three comparison examples will be described below by indicating the same or similar configurations as the present embodiment with the same reference numerals used in the first embodiment.

First Comparison Example

As shown in FIG. 3, a voltage detection circuit 101 according to a first comparison example includes switches S101 to S106 and capacitors C101 and C102. The switch S101 is connected between the input node N1 and the signal line Lop connected to one of detection capacitors (not shown).

A switch S102 is connected between the input node N2 and the signal line Lom connected to the other of the detection capacitors (not shown). A switch S103 is connected between the input node N1 and the signal line Lom. A switch S104 is connected between the input node N2 and the signal line Lop.

A switch S105 is connected between the input node N1 and each gate of the switches S101 and S102. A switch S106 is connected between the input node N1 and each gate of the switches S103 and S104. The driving signal φ1 is applied to each gate of the switches S101, S102 and S106 through the capacitor C101. The driving signal φ2 is applied to each gate of the switches S103, S104 and S105 through the capacitor C102.

As described above, the voltage detection circuit 101 according to the first comparison example is configured to detect the voltage by chopping operation of four switches S101 to S104, each of which is formed of an nMOS transistor. The switches S101 to S104 are capacitively driven through the capacitors C101 and C102. In this configuration, a body diode Dp101 exists between a source and a drain of the first detection switch S101 with its anode at the source side.

For this reason, it is likely that a leak current flows through the body diode DP101. This leak current narrows an operation range of the voltage detection circuit 101, that is, narrows the voltage detection range very much. More specifically, as shown in FIG. 4, the operation range of the voltage detection circuit 101 is narrowed to the extent that the differential voltage Vip−Vim between the input nodes N1 and N2 is about ±0.7V (forward voltage Vf of a diode). For example, although it is required to be able to detect a voltage lower than −0.7V in case that the battery cell 2, which is a detection target, is a fuel cell, the first comparison example is not usable for such an application.

Second Comparison Example

As shown in FIG. 5, a voltage detection circuit 201 according to a second comparison example includes switches S201, S203, S205, S206, each of which is formed of a pMOS transistor, and switches S202, S204, S207, S208, each of which is formed of an nMOS transistor, capacitors C201 to C204 and diodes D201 to D204. The switch S201 is connected between the input node N1 and the signal line Lop connected to one of detection capacitors (not shown).

The switch S202 is connected between the input node N2 and the signal line Lom connected to one of detection capacitors (not shown). The switch 203 is connected between the input node N1 and the signal line Lom. The switch 204 is connected between the input node N2 and the signal line Lop.

The switches S205 and S206 are connected between the input node N1 and each gate of the switches S201 and S203. The diodes D201 and D203 are connected between the input node N1 and each gate of the switches S201 and S203 with anodes at the gate sides, respectively. The driving signal φ1' is applied to each gate of the switches S201 and S206 through the detection capacitor C201. The driving signal φ2' is applied to each gate of the switches S203 and S205 through the detection capacitor C203.

Switches S207 and S208 are connected between the input node N2 and each gate of the switches S202 and S204, respectively. The diodes D202 and D204 are connected between the input node N2 and each gate of the switches S202 and S204 with anodes at the input node N2 sides, respectively. The driving signal φ1 is applied to each gate of the switches S202 and S208 through the detection capacitor C202. The driving signal φ2 is applied to each gate of the switches S204 and S207 through the detection capacitor C204.

As described above, the voltage detection circuit 201 according to the second comparison example is configured to detect the voltage by chopping operation of four switches S201 to S204, which are combinations of nMOS transistors and pMOS transistors. The switches S201 to S204 are capacitively driven through the capacitors C201 and C202.

Since the voltage detection circuit 201 according to the second comparison example is configured by combining nMOS transistors and the pMOS transistors, an operation range at a positive side (Vip−Vim>0) is wider than that in the first comparison example. In this configuration as well, however, a body diode Dp201 exists between a source and a drain of the switch S201 with its anode at the drain side.

Similarly, a body diode Dp204 exists between a source and a drain of the switch S204 with its anode at the source side.

For this reason, it is likely that leak currents flow through the body diodes DP201 and DP204. These leak currents narrows an operation range of the voltage detection circuit 201 in a negative side (Vip−Vim<0). Specifically, as shown in FIG. 6, the operation range of the voltage detection circuit 201 in the negative side is narrowed to about −0.7V. For this reason, similarly to the First comparison example, although it is required to be able to detect a negative voltage lower than −0.7V in case that the battery cell 2, which is a detection target, is a fuel cell, the second comparison example is not usable for such an application.

Third Comparison Example

As shown in FIG. 7, a voltage detection circuit 301 according to a third comparison example is different from the voltage detection circuit 101 of the first comparison example in that switches S301 and S302 are provided in place of the switches S105 and S106 and that the minimum selector 16 is provided additionally. In this configuration, each backgate of the switches S101 to S104 is connected to the substrate potential supply line Lbn, to which a voltage outputted from the output node Nbn of the minimum selector 16 is applied.

The switch S301 is connected between the gates of the switches S101, S102 and the substrate potential supply line Lbn. The switch S302 is connected between the gates of the switches S103, S104 and the substrate potential supply line Lbn. The switch S301 is turned on and off when the driving signal φ2 is at the high level and the low level, respectively. The switch S302 is turned on and off when the driving signal φ1 is at the high level and the low level, respectively.

In the voltage detection circuit 301 according to the third comparison example, the substrate potentials of the switches S101 to S104 are controlled by the minimum selector 16. That is, the minimum selector 16 applies the lower one of the voltages of the input nodes N1 and N2 to the backgates of the switches S101 to S104 as the substrate potential. Thus, according to the voltage detection circuit 301, current leak through the body diodes is suppressed.

For this reason, according to the voltage detection circuit 301 of the third comparison example, the operation range in the negative side is widened in comparison to the voltage detection circuit 101 of the first comparison example and the voltage detection circuit 201 of the second comparison example. Specifically, as shown in FIG. 8, the operation range of the voltage detection circuit 301 in the negative side is about −2.5V as the differential voltage between the input nodes N1 and N2.

In this configuration, the operation range of the voltage detection circuit 301 in the positive side is made wider than that of the voltage detection circuit 201 of the second comparison example. Specifically, as shown in FIG. 8, the operation range of the voltage detection circuit 301 in the positive side is widened to the extent that the differential voltage between the input nodes N1 and N2 is about +2.5V. This is for the reason that, since the minimum selector 16 operates to perform capacitive driving with a low voltage reference, a gate-source voltage Vgs of a switch connected to the other end is not sufficiently ensured.

The minimum selector 16 has an unstable operation region, in which the operation of the minimum selector 16 does not operate normally, in a range that the differential voltage between the input nodes N1 and N2 is between 0V and about ±Vt. Vt is a threshold voltage of a MOS transistor.

In such an unstable operation region, the substrate potential Vbn of the switches S101 to S104 are not controlled to a fixed potential and unstable varying between −Vt and +Vf.

The worst condition in the unstable substrate potential Vbn is a worst operation point Vbn=+Vf shown in FIG. 8. The gate voltage Vg of the nMOS transistor, which forms each of the switches S101 to S104 varies in a range from +Vf to VDD'+Vf. VDD' is a part of the power supply voltage divided by the parasitic capacitance. For this reason, in a period of turning off the switches S101 to S104, the gate-source voltage Vgs is +Vf and generates a sub-threshold leak.

As a result, in the period of turning off the switches S103 and S104 for example, a leak current IL flows in a route shown in FIG. 9. In this situation, it is assumed that the voltages Vip and Vim at the input nodes N1 and N2 are at voltage levels, which satisfy the conditions of the unstable operation region of the minimum selector 16 and satisfy inequality Vip>Vim.

As shown in FIG. 9, in the period that the switches S103 and S104 are turned off, the switches S101 and S102 are turned on. At the worst condition described above, the sub-threshold leak current is generated in the first detection switch S101. The leak current IL thus flows in the route as indicated by a dotted line in FIG. 9, that is, from the node N1 to the node N2 through the first detection switch S101 and the first detection switch S104. This leak current IL causes a voltage detection error.

Advantage of First Embodiment

In the first embodiment, the switches S1 to S3 are formed of combinations of the pMOS transistors 11, 13 and the nMOS transistors 12, 14, and the maximum selector 15 and the minimum selector 16 are configured to control individually the substrate potentials of the pMOS transistors 11, 13 and the nMOS transistors 12, 14. For this reason, it is possible to widen the detection range of the positive side (Vip−Vim>0) in comparison to the first and the third comparison examples, in which the switches are formed of only nMOS transistors. Further it is possible to widen the detection range of the negative side (Vip−Vim<0) in comparison to the first and the second examples, in which the substrate potentials are not controlled.

More specifically, as shown in FIG. 10, the operation range of the differential voltage detection circuit 5 in the positive side is generally the same as that of the second comparison example, that is, the differential voltage between the input nodes N1 and N2 is about +5.0V. The operation range of the differential voltage detection circuit 5 in the negative side is generally the same as that in the third comparison example, that is, the differential voltage between the input nodes N1 and N2 is about −2.5V. Further, in the first embodiment, the leak current, which is generated because of unstable potential of the substrate described with reference to the third comparison example, can be suppressed in the following manner.

That is, in the first embodiment, the Zener diode 22 is provided between the substrate potential supply lines Lbp and Lbn with the anode of the Zener diode 22 at the substrate potential supply line Lbn side. In this case, as shown in FIG. 10, the maximum selector 15 and the minimum selector 16 do not operate normally in a range, where the differential voltage between the input nodes N1 and N2 is near ±Vt. This region is the unstable operation region. In such an unstable operation region, the substrate potential Vbp of the pMOS transistors 11, 13 and the substrate potential Vbn of the nMOS transistors 12, 14 are not controlled to the fixed potential and remains unstable. In this case, the substrate potential Vbp varies between −Vf and +Vt, and the substrate potential Vbn varies between −Vt and +Vf. However, the substrate potential Vbp and the substrate potential Vbn are maintained in the predetermined potential relation by the Zener diode 22. Specifically, the substrate potential Vbp is fixed to a potential, which is lower than the substrate potential Vbn by an amount of the forward voltage drop Vf of the Zener diode 22.

The worst condition of the substrate potential Vbn, which is unstable, is the n-substrate worst operation point Vbn=+Vf shown in FIG. 10. This is similar to the third comparison example. For this reason, the leak currents are generated in the nMOS transistors 12 and 14. In case that the substrate potential Vbn is at the worst condition as described above, the substrate potential Vbp is the p-substrate operation point Vbp=Vbn−Vf, that is, the low potential (0V), which is lower than the substrate potential Vbn by an amount of the forward voltage drop Vf. For this reason, no leak current is generated in the pMOS transistors 11 and 13.

As described above, in the first embodiment, when the substrate potentials Vbn and Vbp are unstable and the substrate potential Vbn is in the worst condition, the leak currents are generated in the nMOS transistors 12, 14 but no leak current is generated in the pMOS transistors 11, 13. When the substrate potential Vbp is in the worst condition, the leak currents are generated in the pMOS transistors 11, 13 but no leak current is generated in the nMOS transistors 12, 14 similarly to the case that the substrate potential Vbn is in the worst condition. As a result, the leak current is restricted from being generated as follows.

Figure 11:
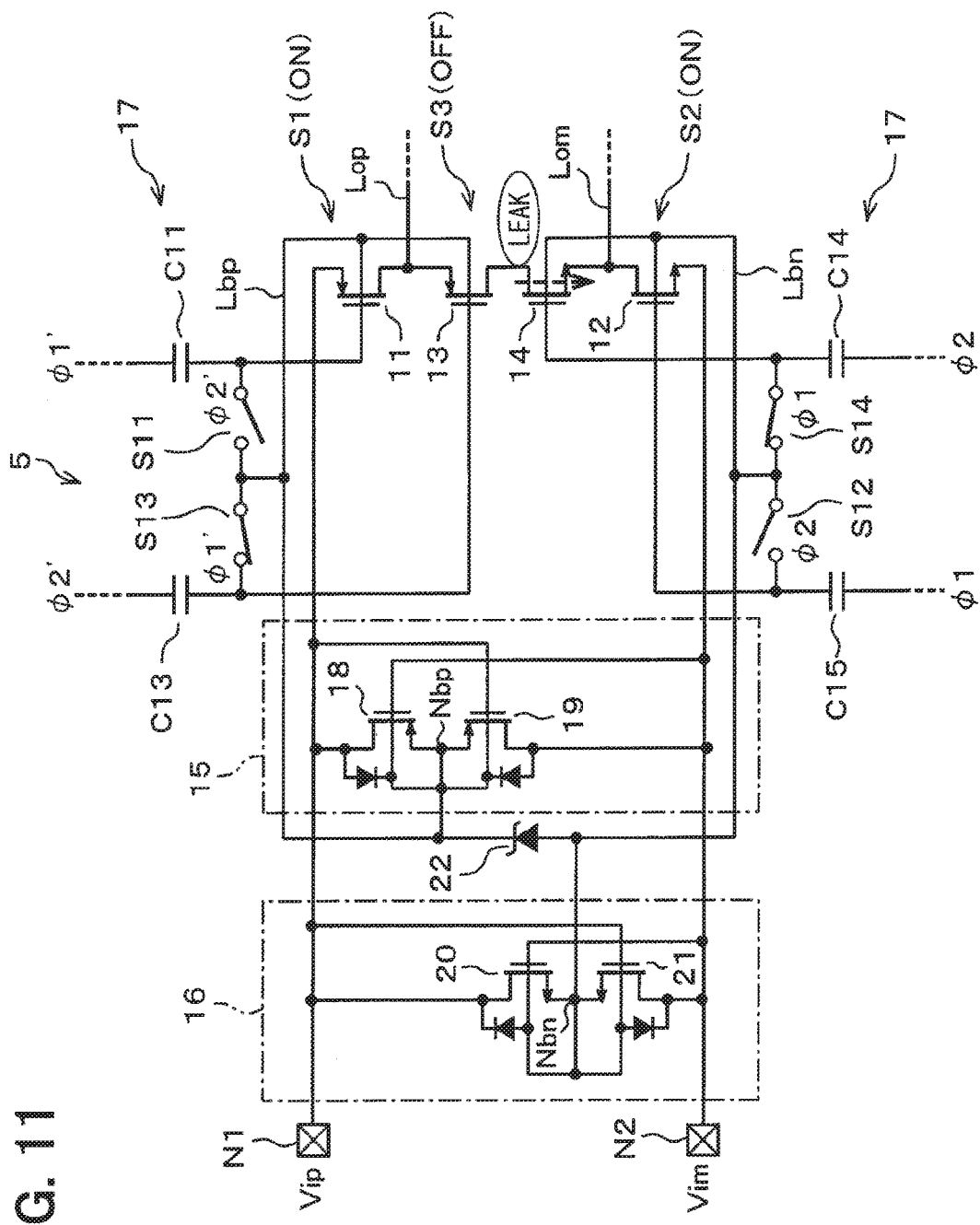
FIG. 11 is a circuit diagram showing a first reason of no leak current generation in the first embodiment.

That is, as shown in FIG. 11, when the substrate potential Vbn is at the worst condition in the period, in which the switches S1 and S2 are turned on and the third detection switch S3 is turned off, the leak current is generated in the nMOS transistor 14 forming the third detection switch S3. However, since no leak current is generated in the pMOS transistor 13 connected in series with the nMOS transistor 14, the leak current does not flow from the input node N1 to the input node N2. In this case, the voltages Vip and Vim at the input nodes N1 and N2 are assumed to satisfy the conditions, which make the maximum selector 15 and the minimum selector 16 unstable, and the voltage Vip is larger than the voltage Vim (Vip>Vim).

Figure 12:
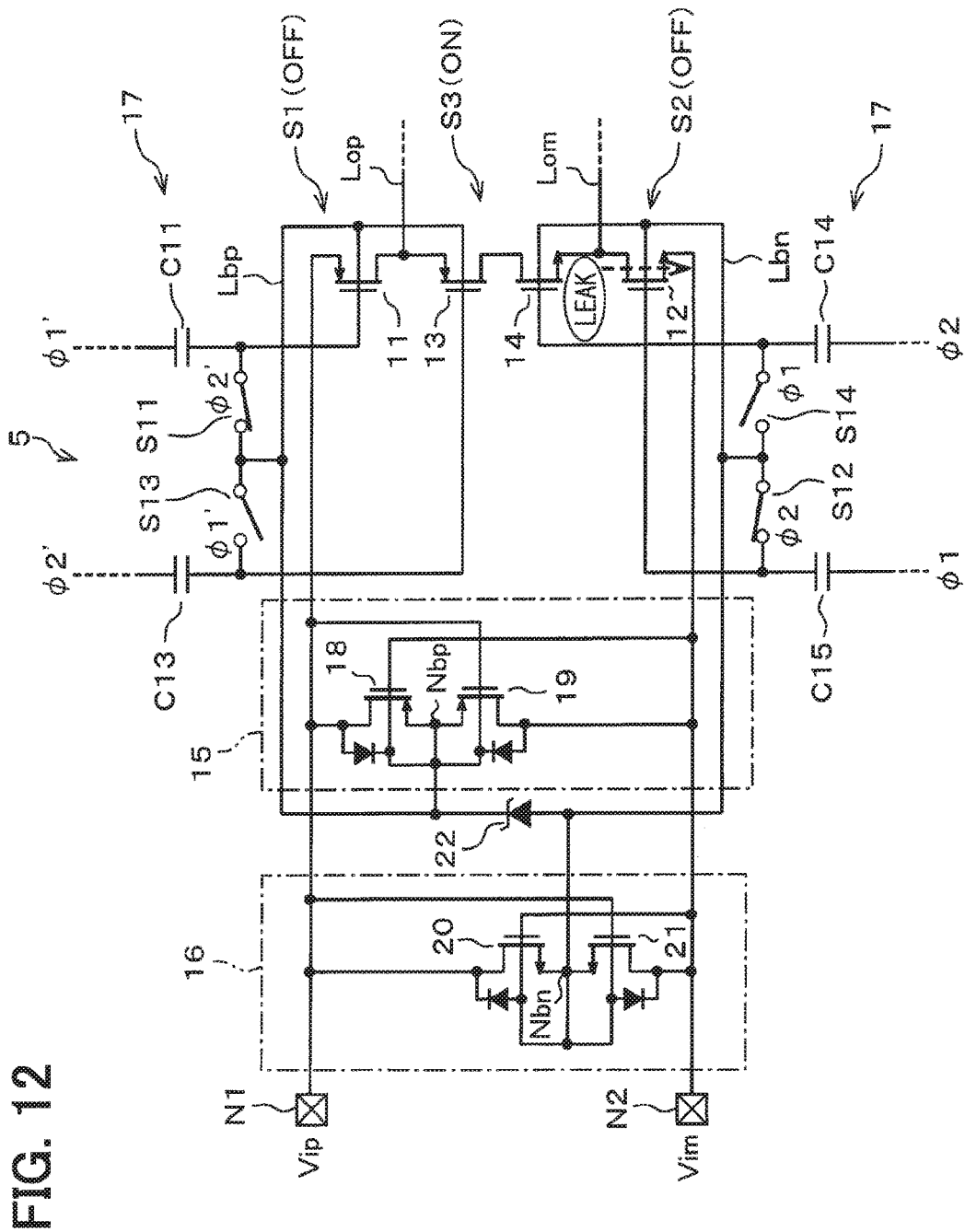
FIG. 12 is a circuit diagram showing a second reason of no leak current generation in the first embodiment.

Further, as shown in FIG. 12, when the substrate potential Vbn is at the worst condition in the period, in which the switches S1 and S2 are turned off and the third detection switch S3 is turned on, the leak current is generated in the nMOS transistor 12 forming the second detection switch S2. However, since no leak current is generated in the pMOS transistor 11 forming the first detection switch S1, the leak current, which affects the accuracy in voltage detection, does not flow from the input node N1 to the input node N2. In this case, the common potential is likely to deviate because of the leak current of the nMOS transistor 12. However, since no leak current flows as described above, no error arises in the voltage detection.

As described above, in the differential voltage detection circuit 5 according to the first embodiment, the switches S1 to S3 are formed of a combination of the pMOS transistors and the nMOS transistors and the substrate potentials of the pMOS transistor and the nMOS transistors are controlled individually by the minimum selector 15 and the minimum selector 16. As a result, the differential voltage detection circuit 5 can widen the operation range (detection range of the differential voltage) in both positive and negative polarity ranges in comparison to the comparison examples described above.

Further, in the differential voltage detection circuit 5 according to the first embodiment, the Zener diode 22 is provided between the substrate potential supply lines Lbp and Lbn with its anode at the substrate potential supply line Lbn side, and the substrate potential Vbn is fixed to the voltage, which is lower than the substrate potential Vbp by the amount of Vf, in the unstable operation region, in which the maximum selector 15 and the minimum selector 16 do not operate normally. As a result, in the differential voltage detection circuit 5, the leak current, which is generated because the substrate potentials Vbp and Vbn are not controlled and remain unstable when the input differential voltage is small, is prevented from being generated. It is thus possible to detect the differential voltage between the positive and negative voltages accurately over a wide range while suppressing generation of the leak current.

In the differential voltage detection circuit 5 according to the first embodiment, the nMOS transistor and the pMOS transistor are arranged symmetrically. For this reason, the substrate potentials Vbp and Vbn are in the range of ±Vf/2 in actuality and less likely to become the worst condition. As a result, it is possible to eliminate the potential fixing part (Zener diode 22), which fixes the substrate potentials Vbp and Vbn in the predetermined potential relation. For the similar reason, it is also possible to form the third detection switch S3 with only one of the pMOS transistor 13 and the nMOS transistor 14 in place of the series connection of the pMOS transistor 13 and the nMOS transistor 14.

As described above, the differential voltage detection circuit 5 according to the first embodiment, the operation range in the negative side is limited to about −2.5V. The reason of this range limitation and a method of widening the range will be described below.

<Reason of Limitation on Negative-Side Operation Range>

When the differential voltage between the input nodes N1 and N2 increases in the negative side, that is, the negative voltage increases, the nMOS transistor 12 forming the second detection switch S2 cannot be turned on sufficiently and hence the operation range in the negative side is limited. That is, when the negative voltage increases, the substrate potential Vbn becomes lower relative to the source voltage Vs of the nMOS transistor 12.

In the MOS transistor such as nMOS transistor 12, when the source potential is different from the ground potential GND, the substrate bias appears and the threshold voltage Vt increases with the substrate bias. For this reason, as the negative voltage increases, the threshold voltage Vt increases because of the substrate bias effect and the nMOS transistor 12 is not easily turned on. Even when the nMOS transistor 12 is turned on, the on-resistance remains high. Thus, in case of a CMOS of 5V, for example, the negative-side operation range of the differential voltage detection circuit 5 is about −2.5V.

<Method of Widening Negative-Side Operation Range>

As far as the withstanding voltage is not critical, it is possible to widen the operation range by increasing voltage amplitudes of the driving signals φ1 and φ2 from present values (+5V) to higher values (for example, +7V). Thus it becomes possible to sufficiently turn on the nMOS transistor 12, the threshold voltage Vt of which is increased by the substrate bias effect, and widen the negative-side operation range of the differential voltage detection circuit 5.

Second Embodiment

Figure 13:
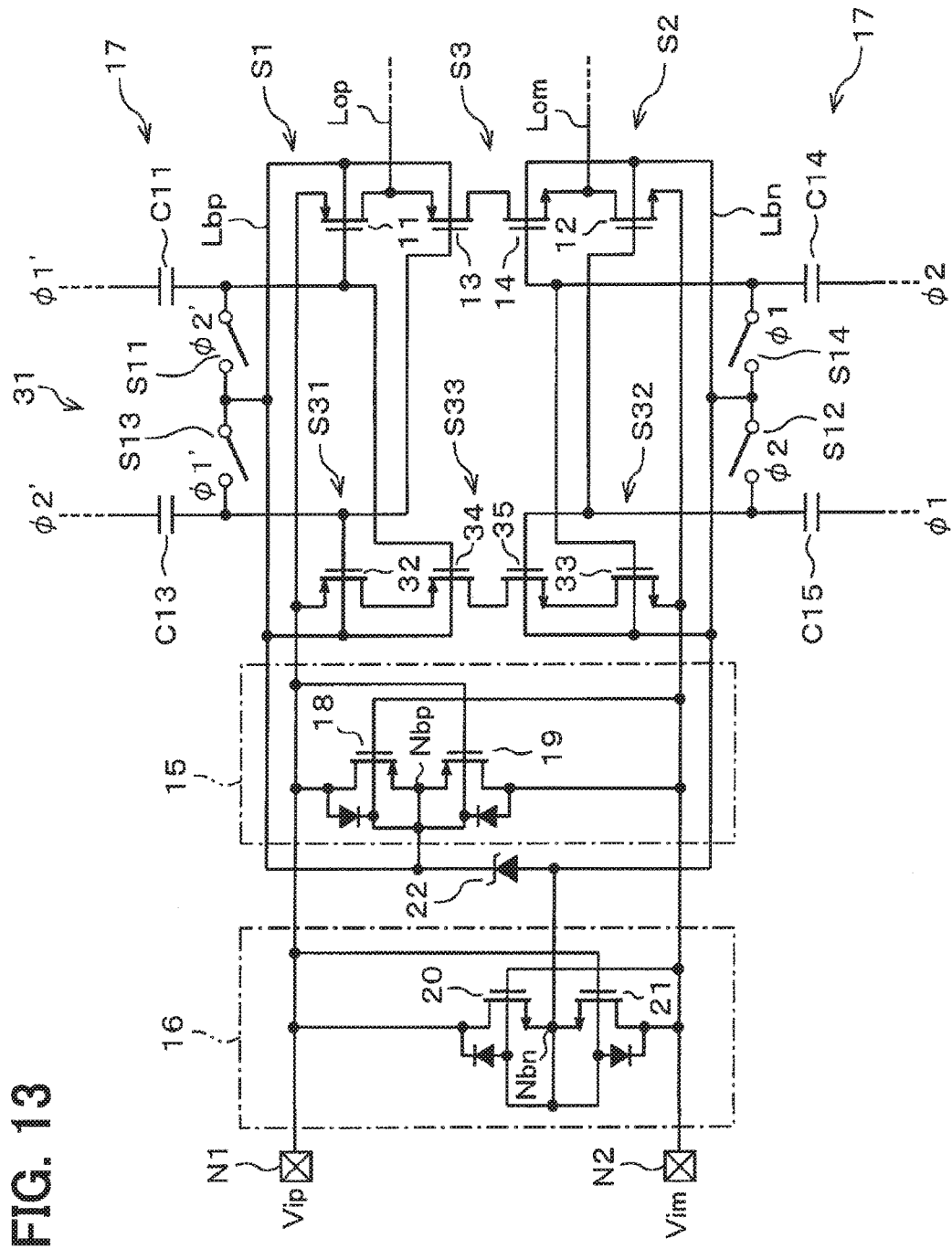
FIG. 13 is a circuit diagram schematically showing a high voltage side of a voltage detection circuit according to a second embodiment.

A second embodiment will be described next with reference to FIG. 13. As shown in FIG. 13, a voltage detection circuit 31 includes switches S31 to S33 at a high voltage side in addition to the configuration of the differential voltage detection circuit 5 of the first embodiment shown in FIG. 2. The switches S31 to S33 are provided as first to third dummy switches, respectively.

The switch S31 is formed of a pMOS transistor 32 with its source connected to the input node N1. The switch 32 is formed of an nMOS transistor 33 with its source connected to the input node N2. The switch 33 is formed of a series circuit of a pMOS transistor 34 and an nMOS transistor 35. A source of the pMOS transistor 34 is connected to a drain of the pMOS transistor 32. The drain of the pMOS transistor 32 is connected to a drain of an nMOS transistor 35. A source of the nMOS transistor 35 is connected to a drain of the nMOS transistor 33.

Backgates of the pMOS transistors 32 and 34 are connected to the substrate potential supply line Lbp. Backgates of the nMOS transistors 33 and 35 are connected to the substrate power supply line Lbn. A gate of the pMOS transistor 32 is connected to the substrate potential supply line Lbp through the switch S13 and to one end of the capacitor C13. A gate of the pMOS transistor 34 is connected to the substrate potential supply line Lbp through the switch S11 and to one end of the capacitor C11.

A gate of the nMOS transistor 33 is connected to the substrate potential supply line Lbn through the switch S14 and to one end of the capacitor C114. A gate of the nMOS transistor 35 is connected to the substrate potential supply line Lbn through the switch S12 and to one end of the capacitor C12.

As described above, the switches S31, S32 and S33 are configured similarly to the switches S1, S2 and S3, respectively. The switches S31, S32 and S33 are dummy switches, which do not contribute to voltage detection operation. In this case, the driving part 17 drives the switches S31 to S33 as well. The switches S31 to S33 are configured to operate in opposite phase relations to the switches S1 and S3.

As described above, in the second embodiment, the voltage detection circuit 31 is configured to include the switches S31 to S33, which are dummy switches configured similarly to the switches S1 to S3, respectively, and the driving part 17 is configured to capacitively drive the switches S31 to S33. With this configuration, the driving part 17 is load-balanced, and the circuit configuration of the nMOS transistors and the pMOS transistors have more improved symmetric relation. As a result, according to the second embodiment, the substrate potentials Vbp and Vbn are less likely to become the worst condition and hence generation of the leak current is suppressed more.

Third Embodiment

Figure 14:
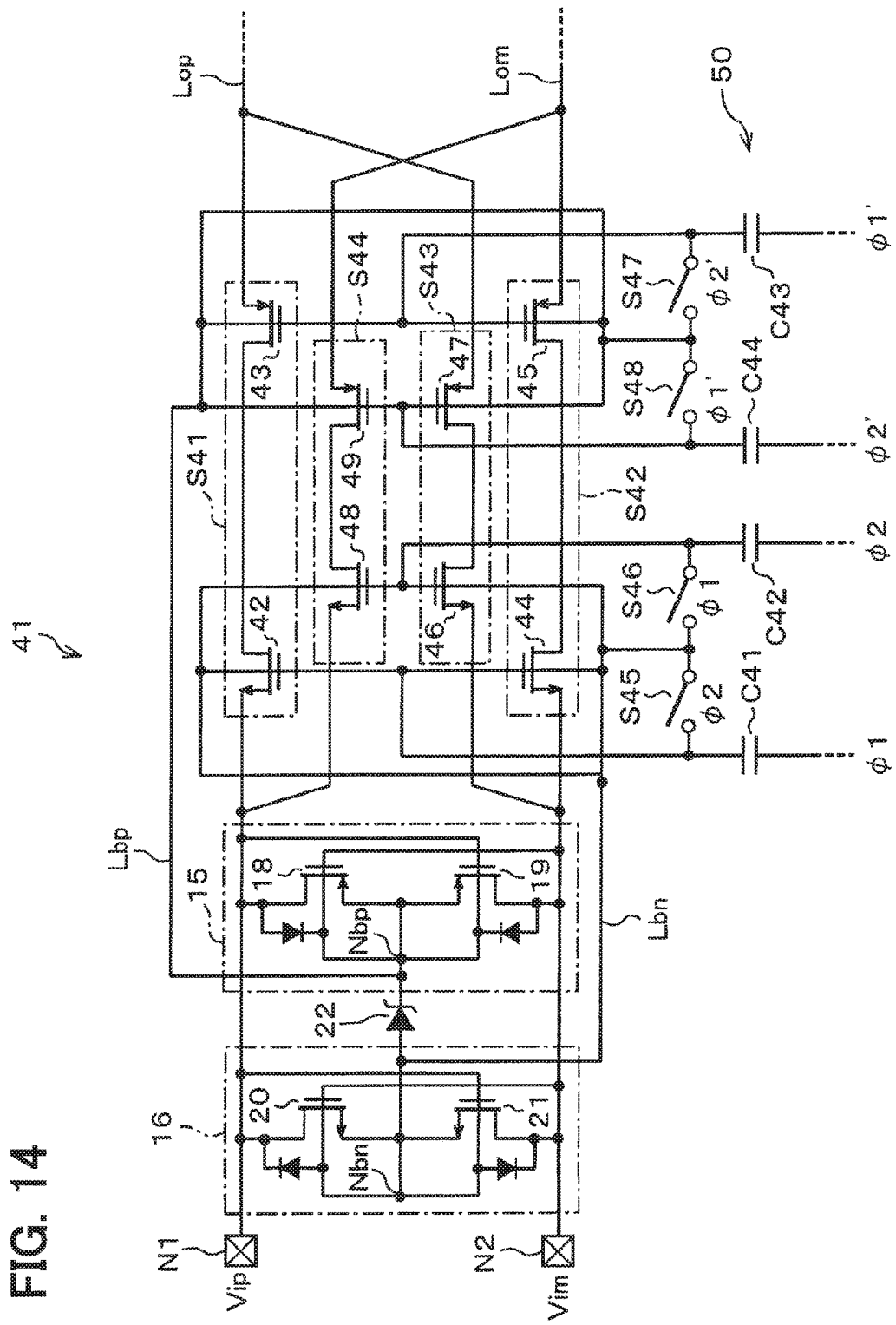
FIG. 14 is a circuit diagram schematically showing a high voltage side of a voltage detection circuit according to a third embodiment.

A third embodiment will be described next with reference to FIG. 14. As shown in FIG. 14, a voltage detection circuit 41 according to the third embodiment is different from the differential voltage detection circuit 5 of the first embodiment in that switches S41 to S44 are provided in place of the switches S1 to S3 and capacitors C41 to C44 and switches S45 to S48 are provided in place of the capacitors C11 to C14 and the switches S11 to S14.

The switch S41 is provided as the first detection switch to open and close a path between the input node N1 and the signal line Lop. The switch S42 is provided as the second detection switch to open and close a path between the input node N2 and the signal line Lom. The switch S43 is provided as the third detection switch to open and close a path between the input node N2 and the signal line Lop. The switch S44 is provided as the fourth detection switch to open and close a path between the input node N1 and the signal line Lom. The switches S41, 42 and the switches S43, S44 are arranged to be turned on and off complementarily.

The switch S41 is formed of an nMOS transistor 42 and a pMOS transistor 43 connected in series. A source of the nMOS transistor 42 is connected to the input node N1 and its drains connected to a drain of the pMOS transistor 43. A source of the pMOS transistor 42 is connected to the signal line Lop. The switch S42 is formed of an nMOS transistor 44 and a pMOS transistor 45 connected in series. A source of the nMOS transistor 44 is connected to the input node N2 and its drain is connected to a drain of the pMOS transistor 45. A source of the pMOS transistor 45 is connected to the signal line Lom.

The switch S43 is formed of an nMOS transistor 46 and a pMOS transistor 47 connected in series. A source of the nMOS transistor 46 is connected to the input node N2 and its drain is connected to a drain of the pMOS transistor 47. A source of the pMOS transistor 47 is connected to the signal line Lop. The switch S44 is formed of an nMOS transistor 48 and a pMOS transistor 49 connected in series. A source of the nMOS transistor 48 is connected to the input node N1 and its drain is connected to a drain of the pMOS transistor 49. A source of the pMOS transistor 49 is connected to the signal line Lom.

Backgates of the nMOS transistors 42, 44, 46 and 48 are connected to the substrate potential supply line Lbn. A voltage outputted from the output node Nbn of the minimum selector 16 is applied to the substrate potential supply line Lbn. Backgates of the pMOS transistors 43, 45, 47 and 49 are connected to the substrate potential supply line Lbp. A voltage outputted from the output node Nbp of the maximum selector 15 is applied to the substrate potential supply line Lbp.

Gates of the nMOS transistors 42 and 44 are connected to the substrate potential supply line Lbn through the switch S45 and connected to one end of the capacitor C41. The driving signal $\varphi 1$ is applied to the other end of the capacitor C41. Gates of the nMOS transistors 46 and 48 are connected to the substrate potential supply line Lbn through the switch S46 and connected to one end of the capacitor C42. The driving signal $\varphi 2$ is applied to the other end of the capacitor C42.

Gates of the nMOS transistors 43 and 45 are connected to the substrate potential supply line Lbp through the switch S47 and connected to one end of the capacitor C43. The driving signal $-\varphi 1$ is applied to the other end of the capacitor C41. Gates of the pMOS transistors 47 and 49 are connected to the substrate potential supply line Lbp through the switch S48 and connected to one end of the capacitor C44. The driving signal $-\varphi 2$ is applied to the other end of the capacitor C44.

The driving signals $\varphi 1$, $\varphi 2$, $\varphi 1'$ and $\varphi 2'$ are the same as used in the first embodiment. The switches S45 to S47 are turned on and off by the driving signals described above. Specifically, the switch S45 is turned on and off when the driving signal $\varphi 2$ is at the high level and the low level, respectively. The switch S46 is turned on and off when the driving signal φ1 is at the high level and the low level, respectively.

The switch S47 is turned on and off when the driving signal φ2' is at the high level and the low level, respectively. The switch S48 is turned on and off when the driving signal φ1' is at the high level and the low level, respectively. In the configuration described above, the switches S45 to S48 and the capacitors C41 to C44 form a driving part 50, which drives the nMOS transistors 42, 44 46, 48 and the pMOS transistor 43, 45, 47, 49, that is, switches S41 to S44.

The third embodiment described above also provides the similar advantages as the first embodiment. That is, in the voltage detection circuit 41, the operation of turning on the switches S41, S42 and turning off the switches S43, S44 and the operation of turning off the switches S41, S42 and turning on the switches S43, S44 are repeated alternately. Thus, the voltages of the input nodes N1 and N2 are sampled by the capacitors C2 and C3 connected to the signal lines Lop and Lom, respectively, and the sampled charges are transferred. By repetition of the above-described operations of the voltage detection circuit 41, the differential voltage between the input nodes N1 and N2 is detected.

In the configuration described above, each of the switches S41 to S44 includes the series connection of the nMOS transistor and the pMOS transistor. That is, each of the switches S41 to S44 is formed of the combination of the pMOS transistor and the nMOS transistor. As a result, according to the third embodiment, it is possible to widen the operation range, that is, voltage detection range, in comparison to the conventional circuit, in which the switch is formed of only nMOS transistor.

Further, in this case, the substrate potentials of the MOS transistors forming the switches S41 to S44 are controlled by the maximum selector 15 and the minimum selector 16. That is, the substrate potentials of the nMOS transistors 42, 44, 46 and 48 are controlled to the lower one of the voltages of the input nodes N1 and N2 by the minimum selector 16. The substrate potentials of the pMOS transistors 43, 45, 47 and 49 are controlled to the higher one of the voltages of the input nodes N1 and N2 by the maximum selector 15. For this reason, it is possible to prevent the leak current from being generated by the body diode of each MOS transistor. According to the third embodiment, it is thus possible to detect the differential voltage of positive polarity and negative polarity accurately over a wide range while suppressing generation of the leak current.

Further, similarly to the differential voltage detection circuit 5 of the first embodiment, the voltage detection circuit 41 in the third embodiment includes the Zener diode 22 having the anode at the substrate potential supply line Lbn side is provided between the substrate potential supply lines Lbp and Lbn, and the substrate potential Vbn is fixed to the voltage, which is lower than the substrate potential Vbp by the voltage amount Vf, in the unstable operation region, in which the maximum selector 15 and the minimum selector 16 do not operate normally.

For this reason, when the substrate potentials Vbn and Vbp become unfixed, the leak is generated in one of the nMOS transistor and the pMOS transistor but is not generated in the other of the nMOS transistor and the pMOS transistor. Each of the switches S41 to S44 is formed of the series circuit of the nMOS transistor and the pMOS transistor. With this configuration, similarly to the first embodiment, it is possible to suppress generation of the leak current, which is generated because the substrate potentials Vbp and Vbn are not controlled and are not fixed when the differential voltage between the input voltages is small.

Other Embodiment

The voltage detection circuit is not limited to the embodiments described above and shown in the drawings but may be modified or combined.

Although the voltage detection circuits 1, 31 and 41 are applied to detect the differential voltage of the battery cell forming the battery pack in the embodiments described above, the voltage detection circuits 1, 31 and 41 may be applied to any other examples, which detect differential voltages between two input nodes.

The potential fixing part is not limited to the Zener diode 22 but may be any element, which maintains the potentials Vbp and Vbn in the predetermined fixed potential relation in the unstable operation region of the maximum selector 15 and the minimum selector 16. For example, in place of the Zener diode 22, a diode may be used as the potential fixing part between the substrate potential supply lines Lbp and Lbn with its anode on the substrate potential supply line Lbn side.

What is claimed is:

1. A voltage detection circuit of a differential configuration for sampling voltages of two input nodes and detecting a differential voltage between sampled voltages, the voltage detection circuit comprising:
   two detection capacitors paired in a differential configuration;
   a first detection switch formed of a P-channel type MOS transistor for opening and closing a path between one of the two detection capacitors and one of the two input nodes;
   a second detection switch formed of an N-channel type MOS transistor for opening and closing a path between an other of the two capacitors and an other of the two input nodes;
   a third detection switch formed of at least one of a P-channel type MOS transistor and an N-channel type MOS transistor for opening and closing a path between the two detection capacitors;
   a driving part for driving the first detection switch and the second detection switch complementarily to the third detection switch such that the first detection switch and the second detection switch are turned on and off when the third detection switch is turned off and on, respectively;
   a minimum selector for selecting a lower one of the voltages of the two input nodes and applying a selected voltage as a substrate potential of the N-channel type MOS transistor; and
   a maximum selector for selecting a higher one of the voltages of the two input nodes and applying a selected voltage as a substrate potential of the P-channel type MOS transistor.

2. The voltage detection circuit according to claim 1, further comprising:
   a potential fixing part for fixing the substrate potential of the P-channel type MOS transistor and the substrate potential of the N-channel type MOS transistor in a predetermined potential relation in an unstable operation region, in which the minimum selector and the maximum selector are unable to operate normally in correspondence to a difference between the voltages of the two input nodes.

3. The voltage detection circuit according to claim 2, wherein:
the potential fixing part includes at least one of a diode and a Zener diode, which fixes the substrate potential of the P-channel type MOS transistor to be lower than the substrate potential of the N-channel type MOS transistor by a predetermine voltage amount in the unstable operation region.

4. The voltage detection circuit according to claim 1, wherein:
the third detection switch includes a series connection of the P-channel type MOS transistor and the N-channel type MOS transistor.

5. The voltage detection circuit according to claim 1, wherein:
the driving part drives the first detection switch, the second detection switch and the third detection switch through capacitors.

6. The voltage detection circuit according to claim 1, further comprising:
a first dummy switch, a second dummy switch and a third dummy switch, which are configured similarly to the first detection switch, the second detection switch and the third detection switch, respectively,
wherein the driving part further drives the first dummy switch, the second dummy switch and the third dummy switch.

7. The voltage detection circuit according to claim 6, wherein:
the driving part drives the first dummy switch, the second dummy switch and the third dummy switch through capacitors.

8. A voltage detection circuit of a differential configuration for sampling voltages of two input nodes and detecting a differential voltage between sampled voltages, the voltage detection circuit comprising:
two detection capacitors paired in a differential configuration;
a first detection switch for opening and closing a path between one of the two detection capacitors and one of the two input nodes, the first detection switch including a series circuit of a P-channel type MOS transistor and an N-channel type MOS transistor;
a second detection switch for opening and closing a path between an other of the two capacitors and an other of the two input nodes, the second detection switch including a series circuit of a P-channel type MOS transistor and an N-channel type MOS transistor;
a third detection switch for opening and closing a path between the one of the two detection capacitors and the other of the two input nodes, the third detection switch including a series circuit of a P-channel type MOS transistor and an N-channel type MOS transistor;
a fourth detection switch for opening and closing a path between the other of the two detection capacitors and the one of the two input nodes, the fourth detection switch including a series circuit of a P-channel type MOS transistor and an N-channel type MOS transistor;
a driving part for driving the first detection switch, the second detection switch, the third detection switch and the fourth detection switch thereby to turn on and off the first detection switch and the second detection switch and to turn on and off the third detection switch and the fourth detection switch complementarily;
a minimum selector for selecting a lower one of the voltages of the two input nodes and applying a selected voltage as a substrate potential of the N-channel type MOS transistor; and
a maximum selector for selecting a higher one of the voltages of the two input nodes and applying a selected voltage as a substrate potential of the P-channel type MOS transistor.

9. The voltage detection circuit according to claim 8, further comprising:
a potential fixing part for fixing the substrate potential of the P-channel type MOS transistor and the substrate potential of the N-channel type MOS transistor in a predetermined potential relation in an unstable operation region, in which the minimum selector and the maximum selector do not operate normally relative to a difference between the voltages of the two input nodes.

10. The voltage detection circuit according to claim 9, wherein:
the potential fixing part includes at least one of a diode and a Zener diode, which fixes the substrate potential of the P-channel type MOS transistor to be lower than the substrate potential of the N-channel type MOS transistor by a predetermined voltage in the unstable operation region.

11. The voltage detection circuit according to claim 8, wherein:
the driving part drives the first detection switch, the second detection switch, the third detection switch and the fourth detection switch through capacitors, respectively.

* * * * *